United States Patent [19]

Tomioka et al.

[11] Patent Number: 4,870,345

[45] Date of Patent: Sep. 26, 1989

[54] SEMICONDUCTOR INTERGRATED CIRCUIT DEVICE

[75] Inventors: Ichiro Tomioka; Kazuhiro Sakashita; Satoru Kishida; Toshiaki Hanibuchi; Takahiko Arakawa, all of Hyogo, Japan

[73] Assignee: Mitsubishi Denki Kabushiki Kaisha, Tokyo, Japan

[21] Appl. No.: 81,095

[22] Filed: Aug. 3, 1987

[30] Foreign Application Priority Data

| Aug. 4, 1986 | [JP] | Japan | 61-183683 |
| Aug. 4, 1986 | [JP] | Japan | 61-183686 |
| Aug. 4, 1986 | [JP] | Japan | 61-183688 |

[51] Int. Cl.$^4$ .................... G01R 31/00; G01R 31/02
[52] U.S. Cl. .................................. 371/22.3; 371/25.1
[58] Field of Search ............ 324/73 R, 158 R, 73 AT; 371/15, 25

[56] References Cited

U.S. PATENT DOCUMENTS

| 4,063,080 | 12/1977 | Eichelberger et al. | 324/73 AT |
| 4,225,958 | 9/1980 | Funatsu | 324/73 R |
| 4,244,048 | 1/1981 | Tsui | 371/25 |
| 4,476,431 | 10/1984 | Blum . | |
| 4,493,077 | 1/1985 | Agrawal . | |
| 4,513,418 | 4/1985 | Bordell, Jr. et al. | 371/15 |
| 4,554,664 | 11/1985 | Schultz . | |
| 4,580,137 | 4/1986 | Fiedler . | |
| 4,621,363 | 11/1986 | Blum . | |
| 4,698,588 | 10/1987 | Hwang et al. | 324/73 R |
| 4,701,922 | 10/1987 | Kuboki et al. | 324/73 R |
| 4,703,257 | 10/1987 | Nishida et al. | 324/73 R |
| 4,752,729 | 6/1988 | Jackson et al. | 371/15 |

FOREIGN PATENT DOCUMENTS

| 28614 | 3/1977 | Japan . |
| 74668 | 6/1981 | Japan . |

Primary Examiner—Reinhard J. Eisenzopf
Assistant Examiner—W. Burns
Attorney, Agent, or Firm—Nixon & Vanderhyde

[57] ABSTRACT

A semiconductor integrated circuit includes cascaded asynchronous sequential logic circuits. Scanning shift registers are provided between the asynchronous sequential circuits to permit test data to be applied to the inputs of the circuits and to latch and shift out output data provided by the circuits in response to the test data. Additional gating circuitry is provided between the scanning shift registers and the inputs of the asynchronous sequential circuits to prevent new data latched into the scanning shift register from causing the asynchronous sequential circuit connected to the scanning shift register output from changing state during testing. This same additional circuitry may be used to provide pulses of controlled width and/or timing to asynchronous sequential circuit inputs in response to externally generated gating control signals.

14 Claims, 11 Drawing Sheets

SEMICONDUCTOR INTERGRATED CIRCUIT DEVICE

BACKGROUND OF THE INVENTION

The present invention relates to a semiconductor integrated circuit device and, more particularly, to a testing circuit for a semiconductor integrated circuit device employing a scan pass.

The integration of a semiconductor integrated circuit device has been remarkably improved by microminiaturization and is expected to be further enhanced in future. A difficulty of testing the semiconductor integrated circuit device has been exponentially increased as this level of integration (number of gates) has been increased. The degree of the ease of testing the semiconductor integrated circuit is determined by two points of the difficulty (observance) of observing the defect of each terminal and the difficulty (controllability) of setting each terminal to a desired logic value-and the deep internal terminal of a large-scale logic circuit network has associated problems in both observance and controllability.

The scan testing system for a semiconductor integrated circuit device is known. The scan testing system improves the observance and the controllability of the deep terminal of the large-scale logic circuit network by observing the large-scale logic circuit network through inserting register circuits each including a shift register function into proper positions of the logic circuit network, connecting the register circuits in series, serially inputting a test pattern from the exterior of a chip at testing time to load predetermined data into the registers, applying a desired logic signal to the logic circuit connected to the data output terminals of the registers to operate the logic circuit, inputting the result from the parallel input terminals of the registers in parallel in the registers, and then serially outputting them out of the chip to observe them.

A fundamental idea of a scan testing system regarding a level sensitive synchronizer circuit is disclosed in Japanese Patent Laid-open No. 28614/1977.

Since the circuit to be observed includes asynchronous sequential circuit here, the scan testing system will be described with reference to Japanese Patent Laid-open No. 74668/1981 as prior art.

FIG. 3 shows a prior-art example of a scan pass type testing circuit with an asynchronous sequential circuit to be observed. In FIG. 3, reference numeral 35 denotes a block of a combination circuit, numerals 36 and 37 denote asynchronous circuit blocks each including a sequential circuit, numerals 8 to 16 denote scan registers provided between the circuit blocks, and numerals 26 to 34 denote data selectors for selecting any of the outputs of the corresponding circuit blocks and the outputs of the scan registers to output the selected output. The output signals of the respective circuit blocks are connected directly to the data input terminals D of the scan registers and the data input terminals D of the data selectors, respectively, and the output terminals Q of the corresponding scan registers are connected to the test data input terminals TD of the data selectors, respectively.

In FIG. 1, reference numeral 1 denotes a test mode selection terminal, which is connected to the mode selection terminals MS of the scan registers and the data selectors, respectively. Numeral 2 denotes a scan-in terminal, and numeral 38 denotes a scan-out terminal. The scan-in terminal 2 is connected to the scan-in terminal SI of the scan register 8, and the output terminal Q of the scan register 8 is connected to the scan-in terminal SI of the scan register 9. Thus, the output terminals Q of the respective scan registers are sequentially connected to the scan-in terminals SI of the next scan registers to resultantly form a shift register pass between the scan-in terminal 2 and the scan-out terminal 38. Numerals 3 to 5 denote ordinary data input terminals, numeral 6 denotes a scan clock input terminal, which is connected to the clock input terminals T of the scan registers.

FIG. 4 shows an example of the scan register shown in FIG. 3, symbol MS denotes a mode selection terminal, symbol D denotes a data input terminal, symbol SI denotes a scan-in terminal, and symbol T denotes a clock input terminal. Numeral 51 denotes an inverter gate, numerals 52 and 53 denote 2-input AND gates, numeral 54 denotes a 2-input OR gate, numeral 55 denotes an edge trigger D type flip-flop (hereinbelow referred to as "D-FF"), and symbol Q denotes a data output terminal.

FIG. 5 shows an example of the data selector shown in FIG. 3. Symbol MS denotes a mode selection terminal, symbol TD denotes a test data input terminal, symbol D denotes a data input terminal, numeral 60 denotes an inverter gate, numerals 61 and 62 denote 2-input AND gates, numeral 63 denotes a 2-input OR gate, and symbol Y denotes an output terminal.

The operation of the scan pass type testing circuit will be described.

The ordinary operation will be first described. In this case, a signal "H" is applied to the test mode selection terminal 1 (MS), and the scan clock terminal 6 (TS or T) is fixed to a voltage "L". As a result, the input and output terminals of the corresponding circuit blocks are connected directly through the respective data selectors.

This operation will be described with reference to FIG. 5. When a signal "H" is applied to the mode selection terminal MS of the data selector, the data from the data input terminal D is outputted through the AND gate 62 and the OR gate 63 to the output terminal Y. Since the output of the circuit block is connected directly to the data input terminal D of this data selector, the input and output terminals of the corresponding circuit block are connected directly.

The scan mode and the test mode are sequentially repeated as below at testing time to test the respective circuit blocks.

(1) Scan Mode (a) A signal "H" is applied to the test mode selection terminal 1 to set the scan mode. Thus, the scan register selects the input data from the scan-in terminal Si, and the data selector validates the input data from the data input terminal D.

(b) Further, the test data set in the respective scan registers from the scan-in terminal 2 are sequentially scanned in synchronism with the clock applied to the scan clock terminal 6.

(c) Simultaneously, the output data inputted to the respective circuit blocks at the previous testing time are sequentially scanned out from the scan-out terminal 38.

This operation will be described with reference to FIGS. 4 and 5. When a signal "H" is first applied to the mode selection terminal MS of the scan register, the data from the scan-in terminal SI is held in D-FF 55 synchronously with the clock applied to the clock terminal T through the AND gate 53 and the OR gate 54, and the data held simultaneously is output from the output terminal Q. The signal "H" is also applied to the mode selection terminal MS of the data selector at this time, and the data from the data input terminal is outputted to the output terminal Y.

(2) Test Mode (a) After the desired data are set in the respective scan registers, a voltage "L" is applied to the test mode selection terminal 1 to set a test mode.

(b) Thus, the output data of the scan register is applied through the test data input terminal TD of the data selector to the respective circuit blocks.

(c) Simultaneously, the desired test data are applied to the data input terminals 3 to 5.

(d) When the operations of the circuit blocks have been completed, a clock is applied to the scan clock input terminal 6. Thus, the output signals of the respective circuit blocks are held in D-FF in the scan registers through the data input terminals D of the corresponding scan registers.

These operations will be described with reference to FIGS. 4 and 5. When a voltage "L" is first applied to the mode selection terminal MS of the scan register, the data from the data input terminal D is held in D-FF 55 synchronously with the clock applied to the clock input terminal T through the AND gate 52 and the OR gate 54. Since the voltage "L" is also applied to the mode selection terminal MS of the data selector at this time, the data from the test data input terminal TD is outputted to the output terminal Y through the AND gate 61 and the OR gate 63.

Thus, the respective circuit blocks 35 to 37 can be tested. The data selectors in the circuits select the output data of the respective circuit blocks during the scanning operation. In this manner, even if the output value of the scan register is sequentially varied during the scanning operation, the state of the circuit block 35 including the sequential circuit is inhibited from varying. Therefore, even if the circuit block surrounded by the scan pass is the asynchronous sequential circuit as in this example, the scanning test can be performed.

Since the conventional scan testing system is constructed as described above, the system can execute the scan test for the block including the asynchronous sequential circuit. However, when the mode is switched to the scan mode, the data applied to the sequential circuit is generally varied from the serially inputted signal value to the output signal value of the adjacent circuit block. Thus, it is difficult to set the input so that the state of the asynchronous sequential circuit to be observed may not vary. In many cases, there arises a drawback that the scan test cannot be effectively carried out.

SUMMARY OF THE INVENTION

An object of the present invention is to provide a semiconductor integrated circuit device which can eliminate the above-mentioned drawbacks and disadvantages and which can be readily subjected to a scan test together with circuit blocks including asynchronous sequential circuits.

In order to achieve these and other objects, there is provided according to one aspect of the present invention a semiconductor integrated circuit device comprising a scan register provided between circuit blocks to be tested for outputting input data as is in a through state between input and output terminals at ordinary operation time and holding and outputting input data at testing time, and a gate circuit connected to the output terminal of the scan register for outputting a predetermined fixed value at ordinary operation time and in a test mode at testing time to control the output of the test data by the gate control input.

In this aspect of the present invention, the predetermined fixed value can be applied to a circuit block to be tested at scanning time irrespective of the output of the other circuit block and test data can be applied at a predetermined timing thereto at testing time by the gate circuit inserted to the output of the scan register to prevent the data applied to the circuit block to be tested from altering in case of switching the mode at testing time.

In order to achieve these and other objects, there is provided according to another aspect of the present invention a semiconductor integrated circuit device comprising a scan register provided between circuit blocks to be tested and having first and second latches for outputting input data as it is in a through state at least between an input terminal, a gate circuit connected to the output terminal of the scan register for outputting a predetermined fixed value at ordinary operation time and in a test mode at testing time to control the output of the test data by the gate control input, and a latch circuit for outputting the output data of the scan register before scanning operation to control the output of the test data by the control input.

In this another aspect of the present invention, the circuit block to be tested in the scan mode can be fixed to the predetermined value by the gate circuit inserted to the output of the scan register, and the test data of the previous period can be latched by the latch circuit. Thus, it can prevent the input signal of the circuit block to be tested from varying during scanning and the test data does not alter at switching time from the test mode to the scan mode, thereby readily executing the scan test even in the circuit block including the asynchronous sequential circuit.

Another object of the present invention is to provide a semiconductor integrated circuit device which can eliminate the above-mentioned drawbacks and disadvantages, and which can readily execute a scan test with a lesser number of control signal input pins including a circuit block containing an asynchronous sequential circuit.

In order to achieve these and other objects, there is provided according to still another aspect of the present invention, a semiconductor integrated circuit device comprising a scan register provided between circuit blocks to be tested and having first and second latches for outputting input data as it is in a through state at least between an input terminal, first and second gate circuits and a latch circuit connected to the output terminal of the scan register for outputting the output data of the scan register in a test mode at ordinary operation time and testing times, and first fixed data and second fixed data of opposite logic value to the first fixed data or the output data of the scan register of the previous period, and a NOT circuit connected to the control input of the first or second gate circuit to connect at least the control input of the first or second gate circuit of the same stage and the input of the NOT circuit to the same control signal.

In this another aspect of the present invention, of the circuit block to be tested in the scan mode can be fixed at the predetermined value by the gate circuit inserted to the output of the scan register, and the test data of the previous period can be held by the latch circuit. Thus, it can prevent the input signal of the circuit block to be tested from varying during scanning. A clock signal of positive type and a negative signal of the same timing as the clock signal can be controlled by one control signal at testing time and the test data does not alter at switching time from the test mode to the scan mode, thereby readily executing the scan test even in the circuit block including the asynchronous sequential circuit with less number of pins.

DETAILED DESCRIPTION OF THE PREFERRED EMBODIMENTS

Figure 1:
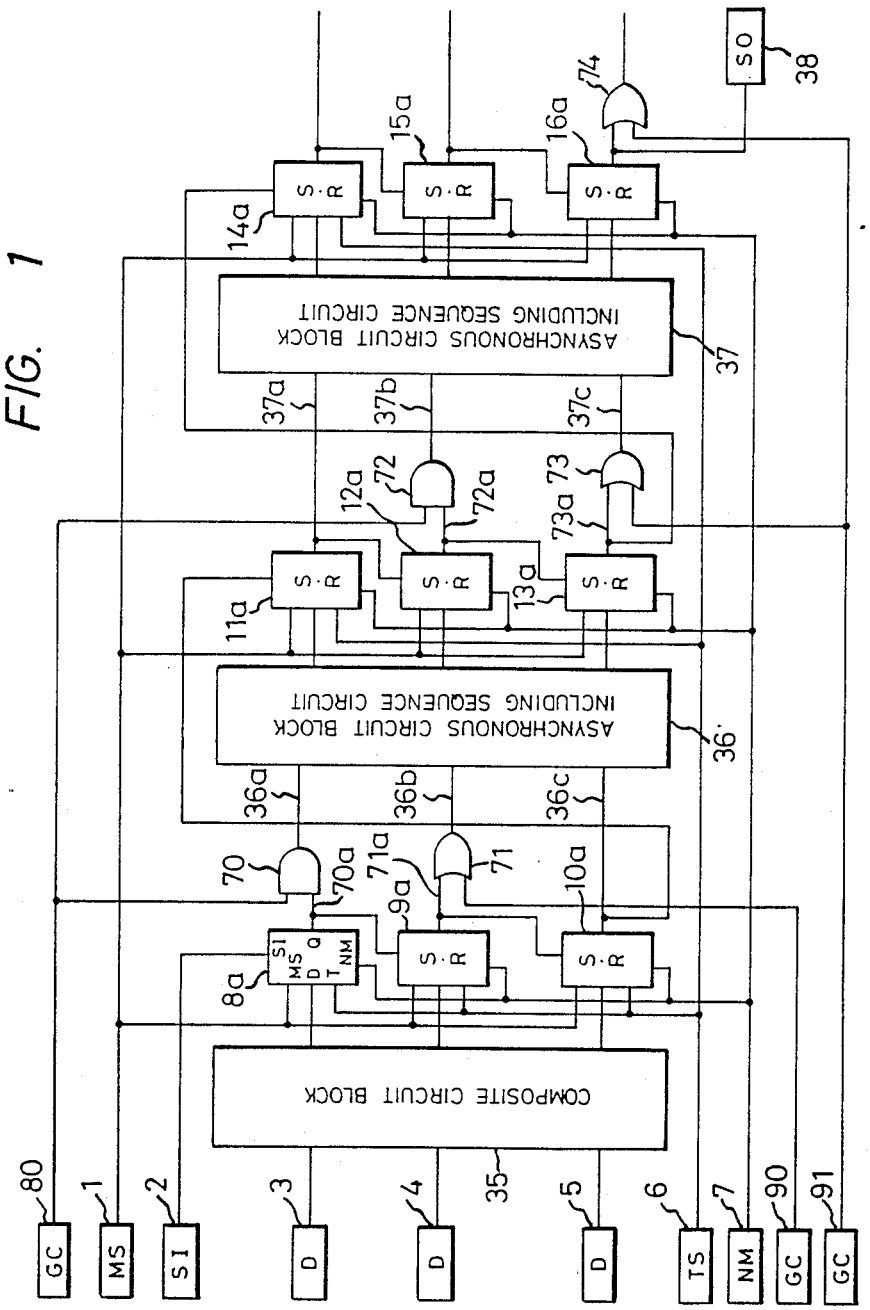
FIG. 1 is a circuit diagram of an embodiment of a semiconductor integrated circuit device according to the present invention.
Figure 3:
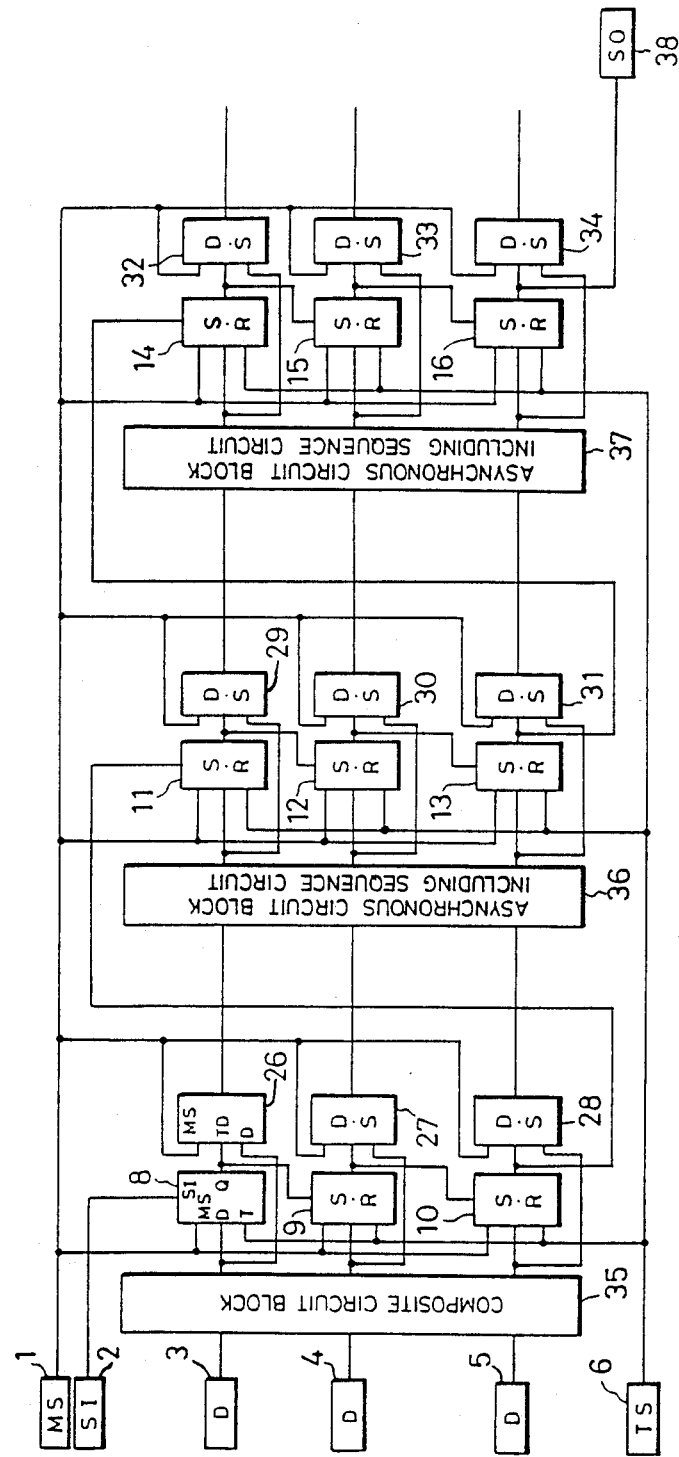
FIG. 3 is a circuit diagram of a prior-art semiconductor integrated circuit device.

FIG. 1 shows the construction of an embodiment of a semiconductor integrated circuit device according to the present invention, wherein the same reference numerals as those in FIG. 3 denote the same or equivalent parts. In FIG. 1, reference numerals 35 to 37 denote circuit blocks to be tested, and a testing circuit according to the embodiment of the present invention is associated in the connecting section. Numerals 70 and 72 denote AND gates, numerals 71, 72, 73 denote OR gates provided between the scan registers and the circuit blocks. Numerals 80, 90, 91 denote gate control input terminals, and symbols 36a to 36c, 37a to 37c denote the inputs of the circuit blocks to be tested. The inputs 36a, 37b of the circuit blocks 36, 37 of this embodiment are active inputs of H level, the inputs 36b, 37c are active inputs of L level, and inputs 36c, 37c become inputs which do not alter the states of the circuit blocks to be tested even if signals to the inputs 36c, 37a change if nonactive signals are input to the other inputs. Numeral 7 denotes a normal mode input terminal for switching between the normal operation and the testing operation.

Figure 4:
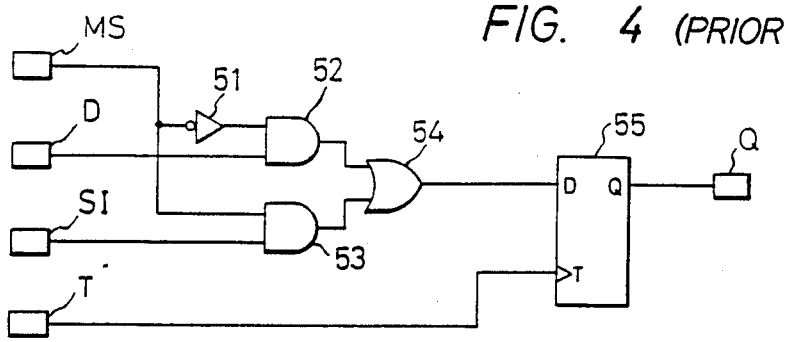
FIG. 4 is a circuit diagram showing a scan register circuit of the prior art device.
Figure 5:
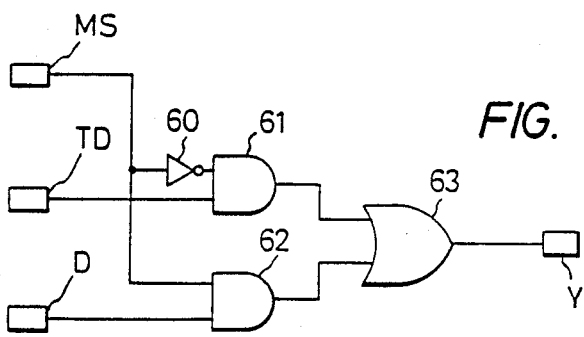
FIG. 5 is a circuit diagram showing a selector of the circuit device in FIG. 3.
Figure 6:
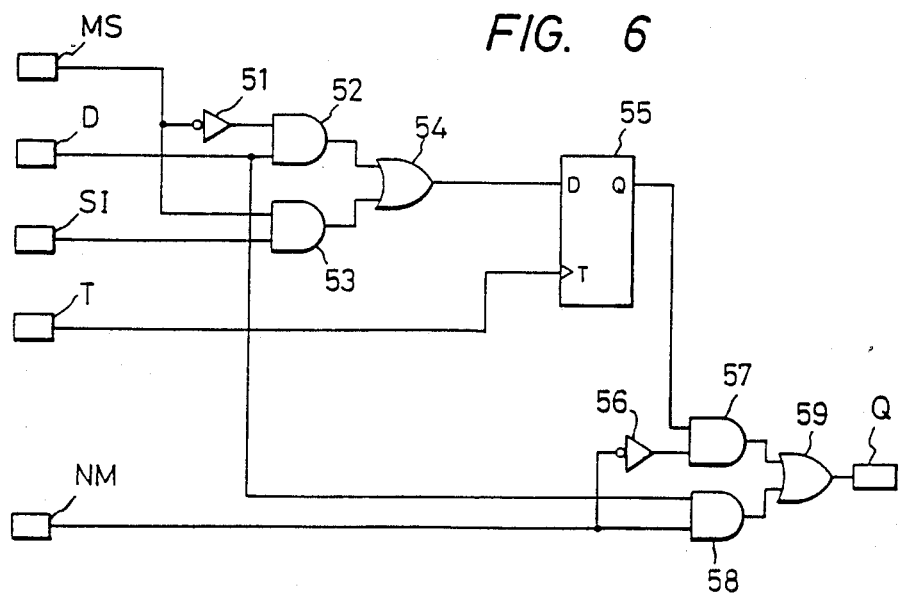
FIG. 6 is a view showing an example of a scan register circuit in the circuit device of FIG. 1.

Scan registers 8a to 16a in this embodiment are different from the prior-art scan registers, and are constructed as shown in FIG. 6. In FIG. 6, numeral 56 denotes an inverter gate, numerals 57 and 58 denote AND gates, numeral 59 denotes an OR gate, and the other arrangement are similar to those in FIG. 4. The scan register constructed as described above transmits the input data from the input terminal D to the output terminal Q as it is when the normal mode signal NM is "H" and operates the same as the prior-art register in FIG. 4 when the signal NM is, on the contrary, "L".

The ordinary operation will be first described. The normal mode input 7 is set to "H", the control input 80 connected to the AND gate is set to "H" and the control inputs 90, 91 connected to the OR gate are set to "L" at ordinary operation time. Thus, signals are transmitted from the D input to the Q output of all the scan registers as they are, and inputs are transmitted through the gates 70 to 74 to the outputs as they are. In this manner, the data between the circuit blocks can be transmitted without influence of the testing circuit as they are, thereby executing a desired ordinary operation.

Then, the testing operation, that is, the case that the normal mode input 7 is set to "L" will be described. In this case, the scan mode and the test mode are switched by the signal of the test mode selection terminal 1, and the circuit block to be tested will be tested by repeating these two modes.

(1) Scan Mode

When the test mode selection terminal 1 is set to "H", the scan mode is obtained. Test data can be scanned in and out the scan register for forming a scan pass by applying a clock to the scan clock input terminal 6 in this mode.

Figure 2:
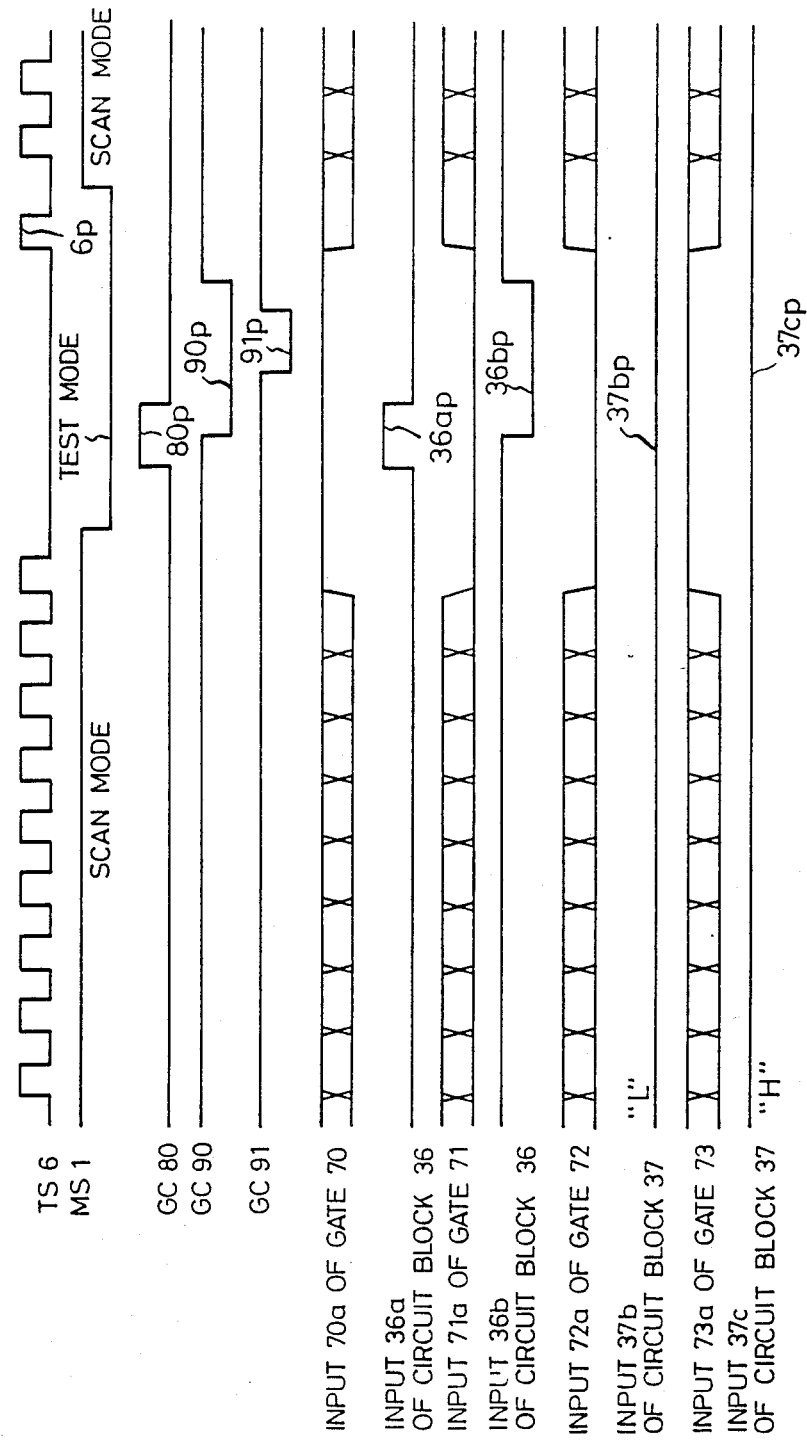
FIG. 2 is a waveform diagram showing the timing of the waveforms for explaining the testing operation in the circuit device.

The waveforms of the operation of the circuit device are shown in FIG. 2. In FIG. 2, the scan mode is obtained when the input 1 is set to "H". In this embodiment, since the scan data is outputted to the output terminal Q of the scan register at scan operation time, a variation in the signal responsive to the data occurs. In FIG. 2, 70a to 73a become an undefinite value during the scanning operation, and can vary synchronously with the scan clock.

However, when the gate control inputs 80, 90, 91 are respectively set to "L", "H", "H" in the scan mode, variations in the outputs of the scan registers are not transmitted to the input of the circuit block to be tested of next stage by the gates 70 to 74, but are instead fixed to a predetermined value. That is, the inputs 36a, 36b, 37b, 37c of the circuit blocks to be tested are respectively fixed to "L", "H", "L", "H". Since these values are non-active values for the inputs, the circuit blocks can be held in a holding state. The inputs 36c, 37a are inputs for holding the state of the circuit block to be tested irrespective of the value of the inputted data as long as the non-active values are input to the other inputs as described above, and since the non-active value is inputted to the input 36a, the circuit block can be held in the holding state.

(2) Test Mode

The test mode selection terminal 1 is set to "L" at test mode time. In this mode, the content of the scan register is inputted to the circuit block to be tested, and the output of the circuit block to be tested is then inputted to the scan register.

The waveforms of the example of this operation are shown in FIG. 2. In FIG. 2, the test mode is obtained when the input 1 is set to "L". In this case, the test data in the scan register can be inputted through the gate circuits or directly to the circuit block to be tested by setting the gate control input 80 to "H" and gate control inputs 90, 91 to "L".838 H" from the scan register 8a in the test mode, it outputs "H" pulse 36a of the same waveform as the pulse 80p when "H" pulse 80p is applied to the control input 80. Similarly, since "L" is inputted to one input 71a (the output of the scan register 9a) of the OR gate 71, the OR gate 71 outputs "L" pulse 36bp of the same waveform as the pulse 90p when the "L" pulse 90p is applied to the control input 90. Since "L" and "H" are applied from the scan registers to the AND gate 72 and the OR gate 73, respectively, as shown in FIG. 2, it becomes the same as the scan mode time, and even if signals such as pulses 80p, 90p are input to the gate control inputs, the pulse waveforms as described above are not outputted.

As described above, the test data are applied to the circuit block to be tested to apply the outputted test result to the scan register by applying the pulse 6p to the clock input terminal 6 to test for one period.

With the arrangement described above, it can be understood that the test data outputted through the gate circuits are determined at the output values by the value of the scan register and the timing is determined by the gate control input. Thus, the gate circuits 70 and 72, or 73 and 74 for generating the test pulse at the same timing can be commonly connected at the gate control terminal.

In the embodiment described above, the AND or OR gate is connected to the output of the scan register. Therefore, its control input is controlled to stop the operation of the circuit to be tested by controlling the control input, and the test pulse data of "H" or "L" of arbitrary timing can be applied to the circuit to be tested. Since the test data of the respective circuit blocks are applied only by the scan data, the test data can be generated without influence of other circuit block, and the scan test can be readily executed.

In the embodiment described above, the scan register is constructed as shown in FIG. 6. However, the arrangement of the scan register is not limited to FIG. 6. For example, the arrangement of the scan register may be constructed as shown in FIG. 8.

Figure 8:
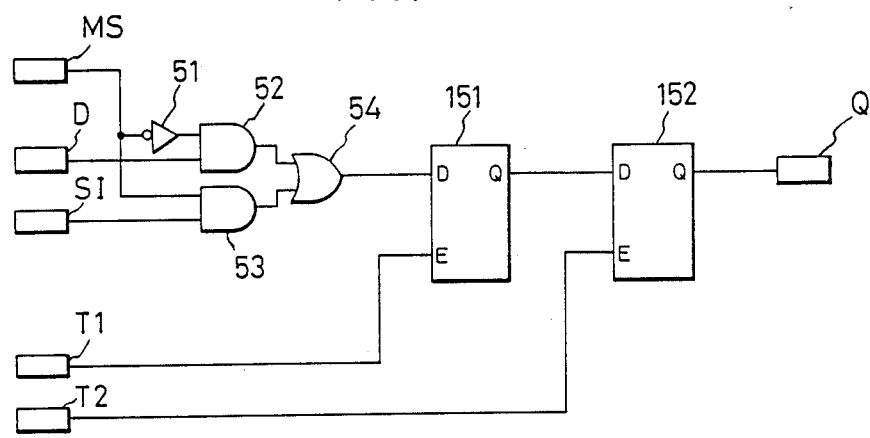
FIG. 8 is a view showing another example of a scan register in the circuit device of FIG. 1.

In FIG. 8, wherein the same reference numerals as those in FIG. 6 denote the same or equivalent parts, reference numerals 151 and 152 denote latches for transmitting data from input D to output Q as they are; latching the input D when E input becomes "L", and outputting the holding data to the output Q.

A testing method using this scan register will be described. The terminal MS is set to "L" and the terminals T1, T2 are set to "H" at ordinary operation time. The terminal MS is set to "H" and 2-phase clocks are applied to the terminals T1; T2 in the scan mode, and the terminal MS is set to "L", a strobe pulse of test result is applied to the terminal T1, and "L" is applied to the terminal T2 in the test mode. The gate control signal is as described above.

As apparent from the above-description, the scan register of the present invention may have the following function.

(1) An ordinary operating function for transmitting data input.

(2) A scanning function for scanning the data by constructing a scan pass by connecting the scan registers in series. In this case, the outputs of the scan registers may not alter.

(3) A function for holding the scanned-in data and outputting held data to the output terminal.

(4) A function for inputting the output from the circuit block to be tested simultaneously with the function in the above paragraph (3).

Figure 7:
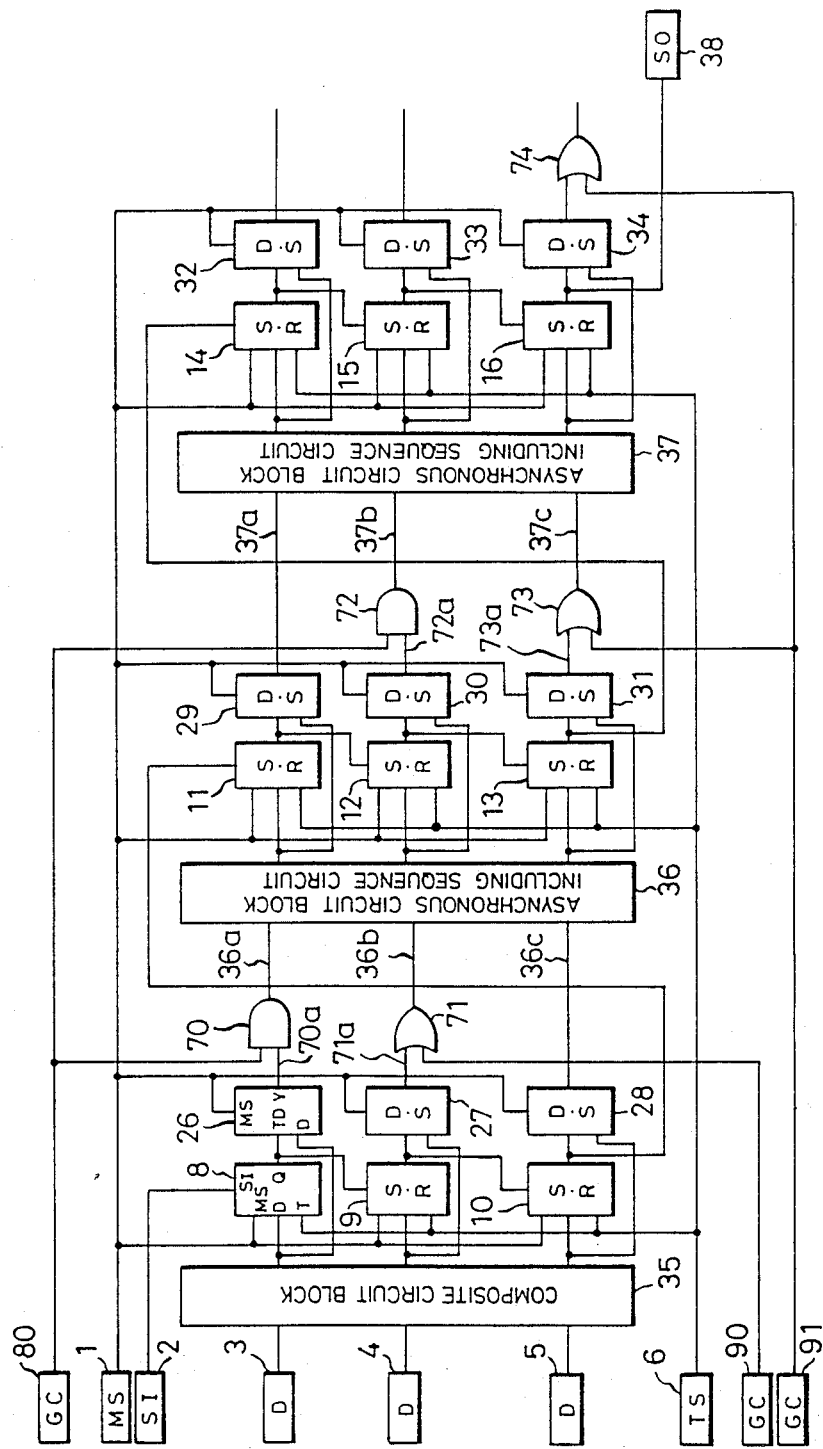
FIG. 7 is a view showing the construction of a semiconductor integrated circuit device applied by the fundamental principle of the present invention.

The fundamental principle of the present invention is applied to the prior-art circuit to construct the circuit arrangement as shown in FIG. 7. FIG. 7 shows a gate circuit added to the output side of the testing circuit of prior art.

The operation of the circuit in FIG. 7 will be described. The mode selection terminal and the control input 80 are set to "H" and the control inputs 90, 91 are set to "L" at ordinary operation time, the selection terminal 1 and the control inputs 90, 91 are set to "H", and the control input 80 are set to "L" in the scan mode, and the selection terminal 1 is set to "L" and the control inputs 80, 90, 91 are applied with "H" and "L" pulses of desired timing in the test mode.

The same advantages as those in the above embodiment can be provided even in the circuit device constructed as described above.

According to the present invention as described above, the gate circuit for outputting the output data of the scan registers to the output terminal of the scan register between the circuit block to be tested in the test mode at the ordinary operation and testing times and a predetermined fixed data in the scan mode at the testing time is provided to control the output of the test data by the gate control input. Therefore, the operation of the circuit block to be tested can be stopped at scanning time, and the test pulse data of arbitrary timing can be applied to the circuit to be tested. Since the test data of the circuit blocks are applied only by the scan data, the test data can be produced without influence of the other circuit block, thereby readily executing the scan test.

Figure 9:
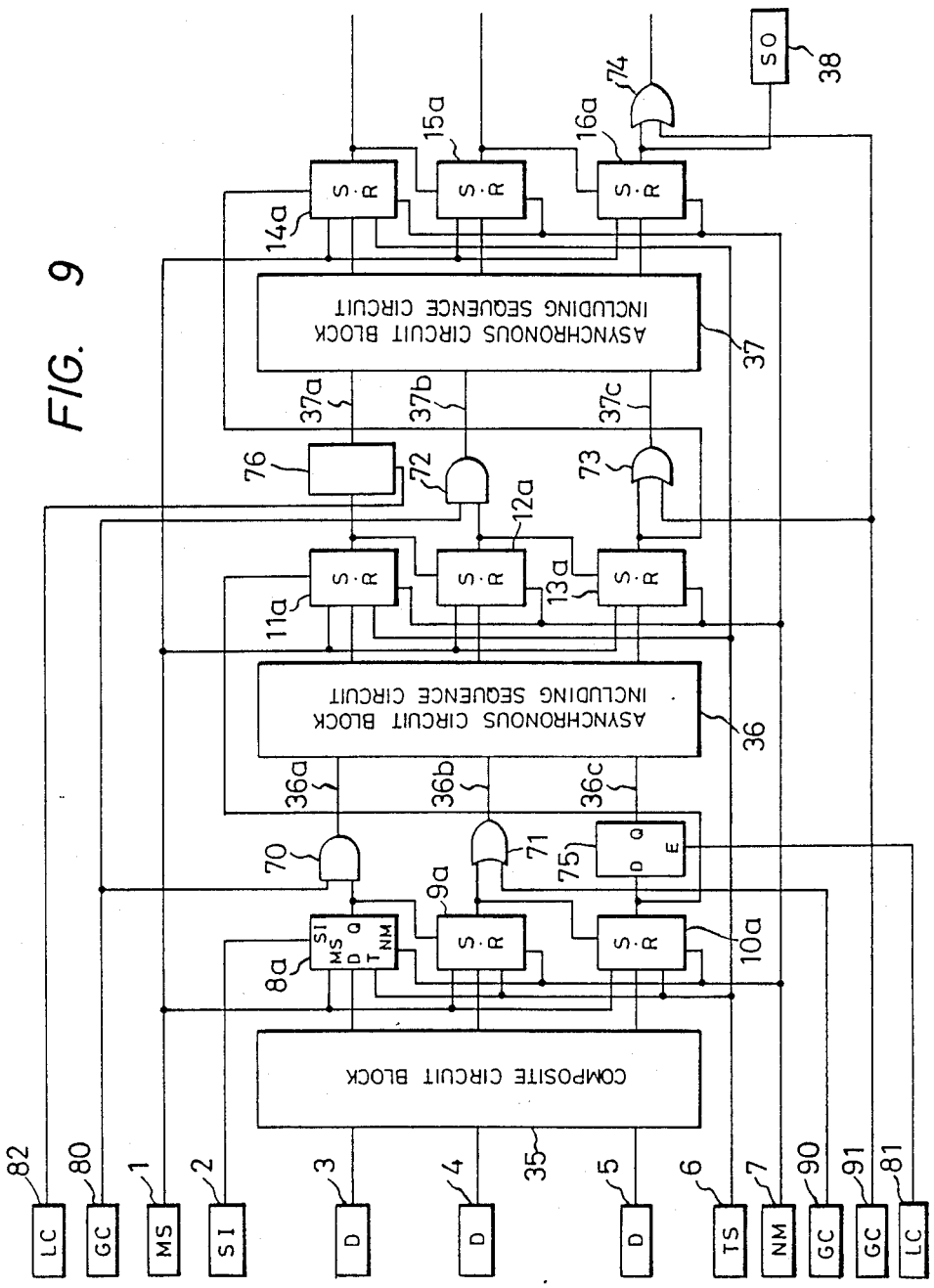
FIG. 9 is a circuit diagram of another embodiment of a semiconductor integrated circuit device according to the present invention.

FIG. 9 shows the construction of another embodiment of a semiconductor integrated circuit device according to the present invention, wherein the same reference numerals as those in FIG. 3 denote the same or equivalent parts. In FIG. 9, reference numerals 35 to 37 denote circuit blocks to be tested, and a testing circuit according to the embodiment of the present invention is associated in the connecting section. Symbols 8a to 16a denote scan registers to be described in detail later. Numerals 75 and 76 denote latches connected to the output terminals of the scan registers 10a, 11a and having through function to transmit the data of input D as it is to its output Q when an input E is "H" and to hold and output the latched content to the output Q when the input E becomes "L". Numerals 70 and 72 denote AND gates, numerals 71, 72, 73 denote OR gates provided between the scan registers and the circuit blocks. Numerals 81 and 82 denote latch control input terminals. Numerals 80, 90, 91 denote gate control input terminals, and symbols 36a to 36c, 37a to 37c denote the inputs of the circuit blocks to be tested. The inputs 36a, 37b of the circuit blocks 36, 37 of this embodiment are active inputs of H level, the inputs 36b, 37c are active inputs of L level, and inputs 36c, 37a become inputs which alter the internal states even if the input data vary in any direction from "H" to "L" or "L" to "H". Numeral 7 denotes a normal mode input terminal for switching between normal operation and testing operation.

Scan registers in this embodiment are different from the prior-art scan registers, and are constructed as shown in FIG. 6. In FIG. 6, numeral 56 denotes an inverter gate, numerals 57 and 58 denote AND gates, numeral 59 denotes an OR gate, and the other arrangements are similar to those in FIG. 4. The scan register constructed as described above transmits the input data from the input terminal D to the output terminal Q as it is when the normal mode signal NM is "H" and operates the same as the prior-art register in FIG. 4 when the signal NM is, on the contrary, "L".

The ordinary operation will be first described. The normal mode input 7 is set to "H", the latch control inputs 81, 82 are set to "H", the control input 80 connected to the AND gate is set to "H" and the control inputs connected to the OR gate are set to "L" at ordinary operation time. Thus, signals are transmitted from the D input to the Q output of all the scan registers as they are, and inputs are transmitted through the latches 75, 76 and the gates 70 to 74 to the outputs as they are. In this manner, the data between the circuit blocks can be transmitted without influence of the testing circuit as they are, thereby executing a desired ordinary operation.

The testing operation will now be described. In this case, the scan mode and the test mode are selected by the signal of the test mode selection terminal 1, and the circuit block to be tested will be tested by repeating these two modes.

(1) Scan Mode

When the test mode selection terminal 1 is set to "H", the scan mode is obtained. Test data can be scanned in and out of the scan register for forming a scan pass by applying a clock to the scan clock input terminal 6 in this mode.

Figure 10:
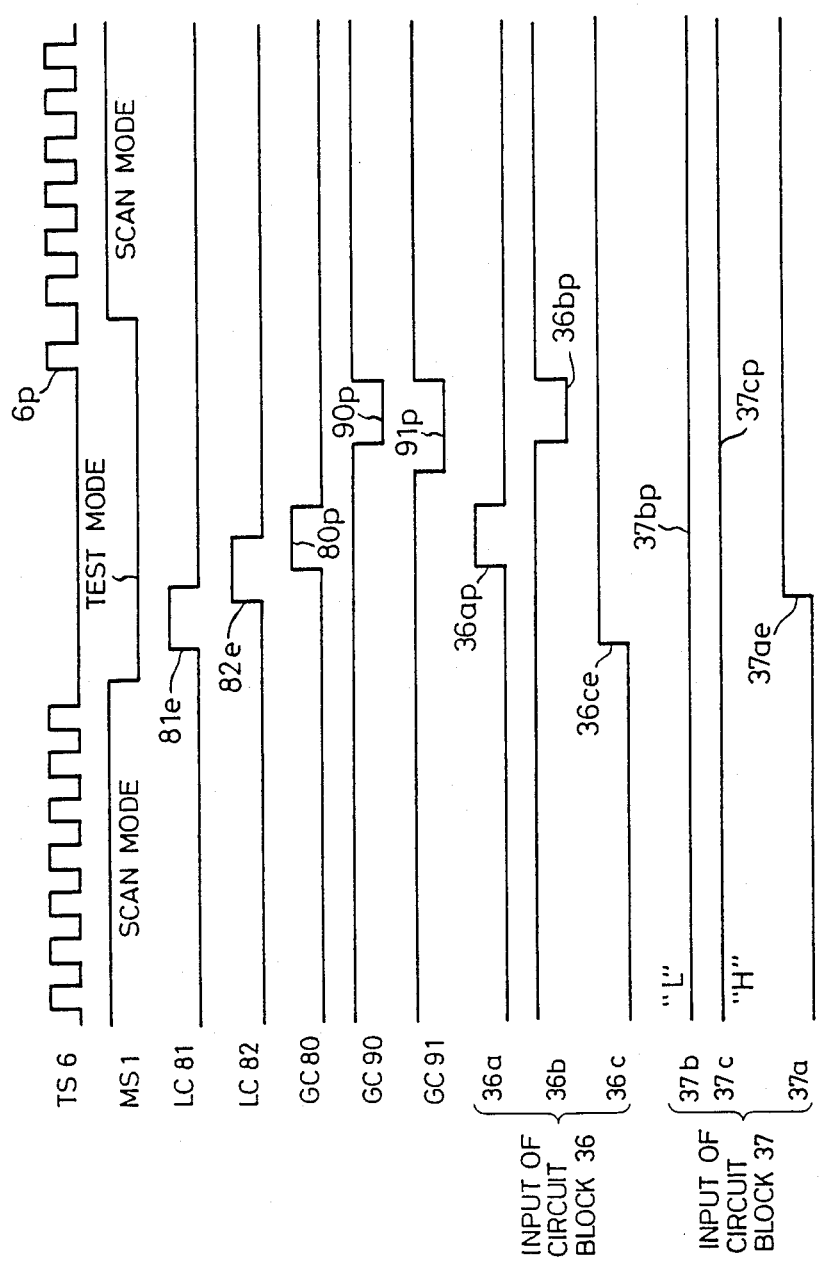
FIG. 10 is a waveform diagram showing the timing of the waveform for explaining the testing operation in the circuit device.
Figure 11:
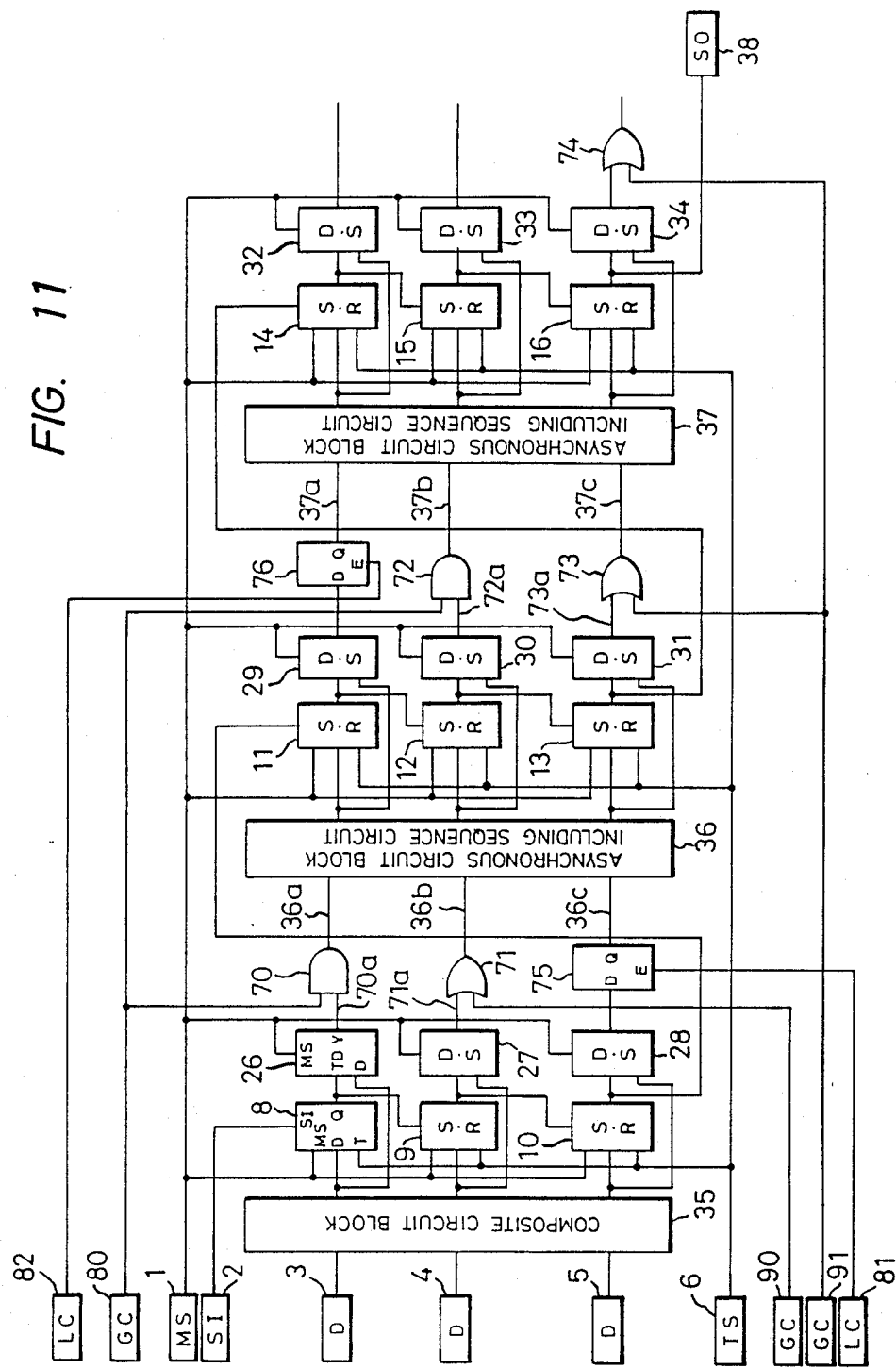
FIG. 11 is a view showing the construction of a semiconductor integrated circuit device applied by the fundamental principle of the present invention.

The waveforms of the operation of the circuit device are shown in FIG. 10. In FIG. 10, the scan mode is obtained when the input 1 is set to "H". In this embodiment, since the scan data is outputted to the output terminal Q of the scan register at scan operation time, a variation in the signal responsive to the data occurs.

However, when the latch control inputs 81, 82 are set to "L" in the scan mode, the inputs 36c, 37a to the circuit to be tested hold the data before scanning operation. When the gate control inputs 80, 90, 91 are respectively sets to "L", "H", "H", the outputs are fixed to "L", "H" AND "H".

Thus, since the inputs of the circuit block to be tested are fixed to the scanning time, the state of the circuit block can be held.

(2) Test Mode

The test mode selection terminal 1 is set to "L" at test mode time. In this mode, the content of the scan register is inputted to the circuit block to be tested, and the output of the circuit block to be tested is then inputted to the scan register.

The waveforms of the example of this operation are shown in FIG. 10. In FIG. 10, the test mode is obtained when the input 1 is set to "L". In the test mode in FIG. 10, assume that the scan registers 8a, 9a, 10a, 11a, 12a, 13a respectively output "H", "L", "H", "H", "L", "H". These test data can be applied to the circuit block to be tested by setting the latches 75, 76 and the gates 70 to 73 to through states. In FIG. 10, the outputs of the latches 75, 76 are outputted synchronously with the rises of the latch control signals 81e, 82e to vary like signals 36ce, 37ae, and the data are held in the latches 75, 76. Since the outputs of the gates 70 to 73 are outputted only during the periods of 80p, 90p, 80p, 91p, they become as waveforms 36ap, 36bp, 37bp, 37cp.

Thus, after the test data are applied to the circuit block to be tested, the test result outputted from the circuit block is inputted to the scan register by applying the pulse 6p to the scan clock input terminal 6. This test result data is sequentially scanned out at next scanning time.

With the arrangement described above, it can be understood that the test data outputted through the latches or the gate circuits are determined at the output values by the value of the scan register and the timing is determined by the gate control input. Thus, the gate circuits 70 and 72, or 73 and 74 for generating the test pulse at the same timing can be commonly connected at the gate control terminal. The starting timing of the gate output signal pulse and the varying timing of the latch output signal are the same, and the through functions of the gate circuits and the latch circuits are the same controlling methods, the can be commonly connected.

In the embodiment described above, the latches, the AND or OR gate is connected to the output of the scan register. Therefore, its control input is controlled to stop the operation of the circuit to be tested by controlling the control input, and the test pulse having arbitrary delay at testing time, or the test pulse having arbitrary delay and width can be applied. Since the test data of the respective circuit blocks are applied only by the scan data, the test data can be generated without influence of other circuit block, and the scan test can be readily executed.

In the embodiment described above, the scan register is constructed as shown in FIG. 6. However, the arrangement of the scan register is not limited to FIG. 6. For example, the arrangement of the scan register may be constructed as shown in FIG. 12.

Figure 12:
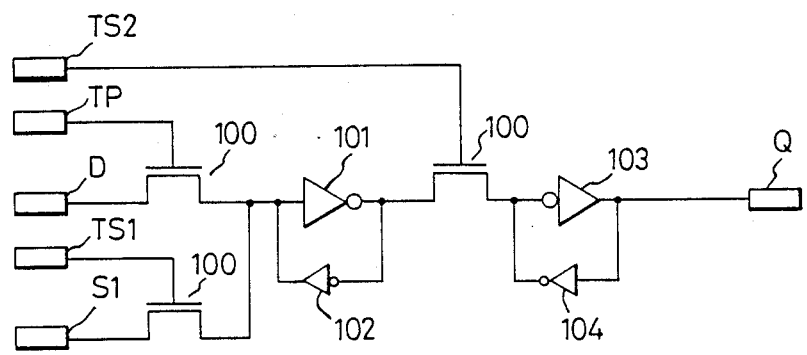
FIG. 12 is a view showing another example of a scan register in the circuit device of FIG. 9.

In FIG. 12, reference numeral 100 denotes an n-type MOS transfer gate, numerals 101 to 104 denote inverters, and the inverters 102, 104 have very small driving capacity. The scan registers thus constructed operate as follows in the respective modes.

(1) Normal Mode

Inputs TP, TS2 are set to "H" and TS1 is set to "L". Then, the data are transmitted from an input D to an output Q as they are.

(2) Scan Mode

An input TP is set to "L", and 2-phase clocks are inputted to TS1, TS2. Then, one stage of shift register which inputs at scan-in terminal SI and outputs at output terminal Q is formed.

(3) Test Mode

The inputs TP, TS1, TS2 are set to "L". The scan-in test data are held in a latch having the inverters 103, 104, and output to the output terminal Q. Thereafter, a predetermined pulse is applied to the latch or the gate connected to the scan register to apply the test data to the circuit block to be tested. Thereafter, "H" is applied to the input TP, and the test result is inputted to the latch having the inverters 101, 102.

As apparent from the above description, the scan register of this invention may have the following functions.

(1) An ordinary operating function for transmitting data input (2) A scanning function for scanning the data by constructing a scan pass by connecting the scan registers in series the scan-in terminal to the scan-out terminal. In this case, the outputs of the scan registers may not alter.

(3) A function for holding the scanned-in data and outputting held data to the output terminal (4) A function for inputting the output from the circuit block to be tested simultaneously with the function in the above paragraph (3).

The test data applied to the circuit block to be tested according to the present invention become as below.

(1) Latch output

The test data having an arbitrary delay by the timing of the latch control at holding and testing time of the test data of previous time at scanning time.

(2) AND gate output

"H" test pulse having arbitrary delay and width by the "L" output at scanning time and the gate control pulse at testing time. When the scan-in test data is set to "L", the test pulse is not outputted.

(3) OR gate output

"L" test pulse having arbitrary delay and width by the "H" output at scanning time and the gate control pulse at testing time. When the scan-in test data are set to "H", the test pulse is not outputted.

Therefore, when the outputs of the above three types are selected in response to the test pattern of the circuit block to be tested, the test of the block including the asynchronous sequential circuit can be readily performed. Even if the input is varied at scanning time, no defective signal may be connected at the output of the scan register as it is without latch.

The fundamental principle of the present invention is applied to the prior-art circuit to construct the circuit arrangement as shown in FIG. 12. FIG. 12 shows a gate circuit added to the output side of the testing circuit of prior art.

The operation of the circuit in FIG. 12 will be described.

(1) Normal Mode

Inputs 1, 80, 81, 82 are set to "H", and 90, 91 are set to "L". Thus, the signal between the circuit blocks is transmitted as it is without influence of the testing circuit.

(2) Scan Mode

The inputs 1, 90, 91 are set to "H", 80, 81, 82 are set to "L", and a scan clock is inputted to the terminal 6, and desired scan data is input to the scan-in terminal 2. In this case, the scanning operation is executed between the scan registers, the scan data is outputted to the scan-out terminal 38, and the circuit blocks are applied with the previous test data at latch output, "L" at the AND gate output, and "H" at the OR gate output.

(3) Test Mode

The input 1 is set to "L", 80, 81, 82 are set to desired "H" pulse, 90, 91 are set to desired "L" pulse. Thus, the latch outputs data at the initial edge of the pulse, and the gate outputs the data at the output period of the pulse. Thereafter, the test data can be inputted to the scan resitter by inputting the pulse to the terminal 6.

The same advantages as those in the above embodiment can be provided even in the circuit device constructed as described above.

According to the present invention as described above, the gate circuit and the latch circuit for holding and outputting the output data of the scan registers to the output terminal of the scan register between the circuit block to be tested in the test mode at the ordinary operation and testing times and a predetermined fixed data or the output data of the scan register before the scanning operation in the scan mode at the testing time is provided to control the output of the test data by the gate control input. Therefore, the operation of the circuit block to be tested can be stopped at scanning time, and the test having arbitrary delay at testing time or test pulse having arbitrary delay and width can be applied. Since the test data of the circuit blocks are applied only by the scan data, the test data can be produced without influence of the other circuit block, thereby readily executing the scan test.

Figure 13:
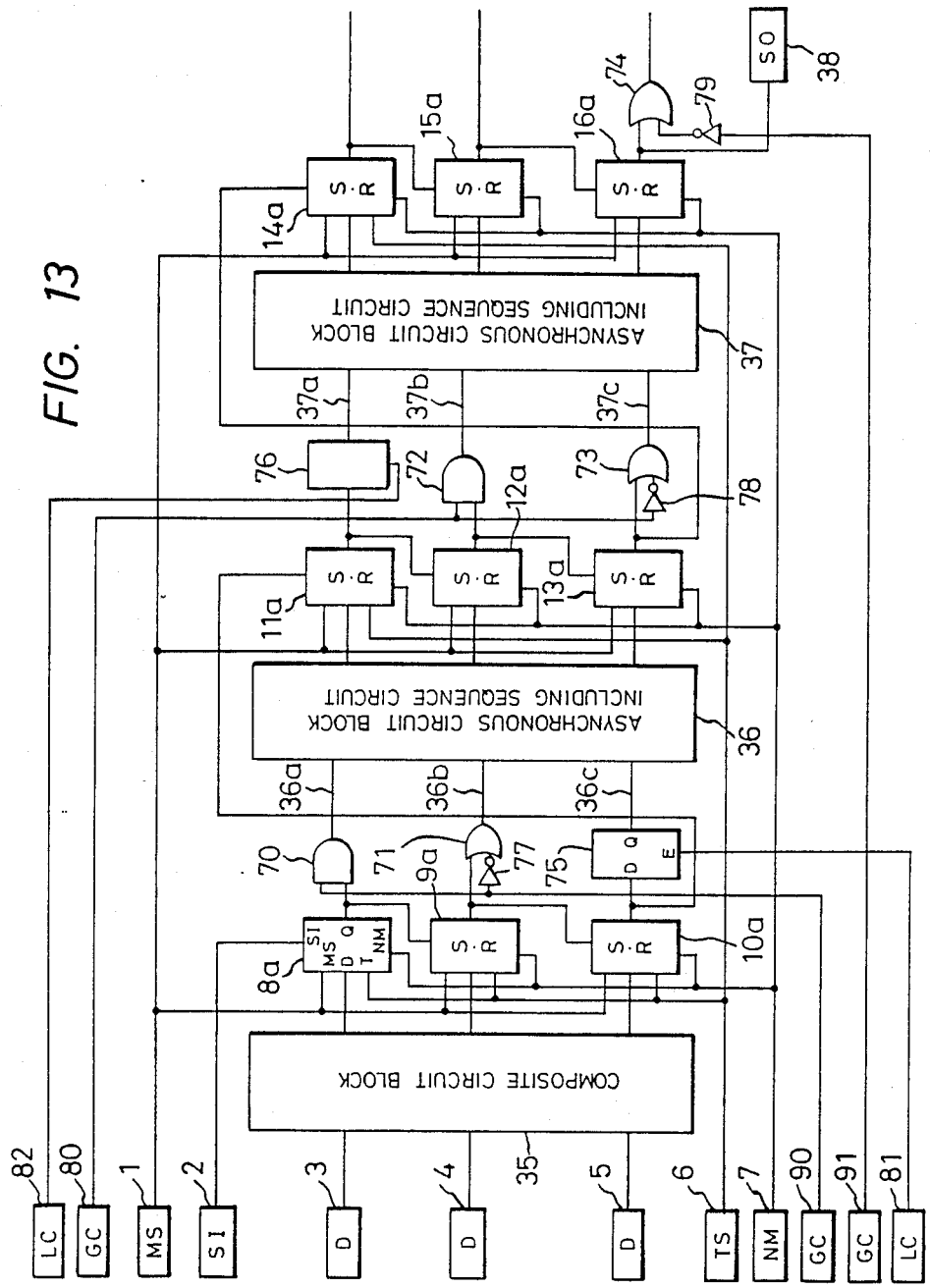
FIG. 13 is a circuit diagram of still another embodiment of a semiconductor integrated circuit device according to the present invention.

FIG. 13 shows the construction of another embodiment of a semiconductor integrated circuit device according to the present invention, wherein the same reference numerals as those in FIG. 3 denote the same or equivalent parts. In FIG. 9, reference numerals 35 to 37 denote circuit blocks to be tested, and a testing circuit according to the embodiment of the present invention is associated in the connecting section. Symbols 8a to 16a denote scan registers to be described in detail later. Numerals 75 and 76 denote latches connected to the output terminals of the scan registers 10a, 11a and having through function to transmit the data of input D as it is to its output Q when an input E is "H" and to hold and output the latched content to the output Q when the input E becomes "L". Numerals 70 and 72 denote AND gates, numerals 71, 72, 73 denote OR gates provided between the scan registers and the circuit blocks, and numerals 77, 78, 79 denote inverters connected to the control inputs of the OR gates. Numerals 81 and 82 denote latch control input terminals. Numerals 80, 90, 91 denote gate control input terminals, and symbols 36a to 36c, 37a to 37c denote the inputs of the circuit blocks to be tested. The inputs 36a, 37b of the circuit blocks 36, 37 of this embodiment are active inputs of H level, the inputs 36b, 37c are active inputs of L level, and inputs 36c, 37a become inputs which alter the internal states even if the input data vary in any direction from "H" to "L" or "L" to "H". Numeral 7 denotes a normal mode input terminal for switching the normal operation and the testing operation.

Scan registers in this embodiment are different from the prior-art scan registers, but are constructed as shown in FIG. 6.

The ordinary operation will be first described. The normal mode input 7 is set to "H", the latch control inputs 81, 82 are set to "H", the gate control inputs 80, 90, 91 are set to "H". Thus, signals are transmitted from the D input to the Q output of all the scan registers as they are, and inputs are transmitted through the latches 75, 76 and the gates 70 to 74 to the outputs as they are. In this manner, the data between the circuit blocks can be transmitted without influence of the testing circuit as they are, thereby executing a desired ordinary operation.

Then, the testing operation, that is, the case that the normal mode input 7 is set to "L" will be described. In this case, the scan mode and the test mode are switched by the signal of the test mode selection terminal 1, and the circuit block to be tested will be tested by repeating these two modes.

(1) Scan Mode

When the test mode selection terminal 1 is set to "H", the scan mode is obtained. Test data can be scanned in and out the scan register for forming a scan pass by applying a clock to the scan clock input terminal 6 in this mode.

Figure 14:
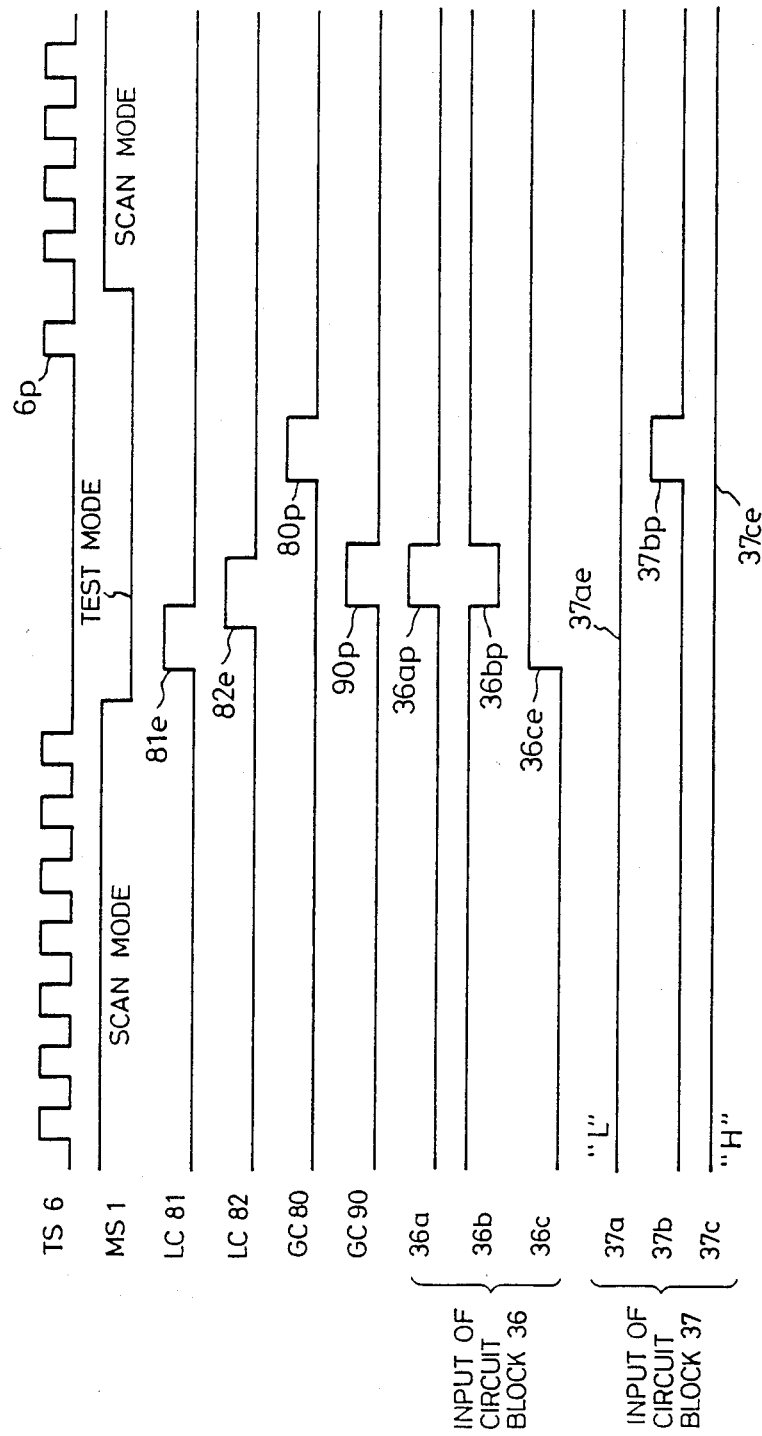
FIG. 14 is a waveform diagram showing the timing of the waveform for explaining the testing operation in the circuit device.

The waveforms of the operation of the circuit device are shown in FIG. 14. In FIG. 14, the scan mode is obtained when the input 1 is set to "H". In this embodiment, since the scan data is outputted to the output terminal Q of the scan register at scan operation time, a variation in the signal responsive to the data occurs.

However, when the latch control inputs 81, 82 are set to "L" in the scan mode, the inputs 36c, 37a to the circuit to be tested hold the data before scanning operation. When the gate control inputs 80, 90 are all set to "L", the inputs 36a, 37b are fixed to "L", and the inputs 36b, 37c are fixed to "H".

Thus, since the inputs of the circuit block to be tested are fixed to the scanning time, the state of the circuit block can be held.

(2) Test Mode

The test mode selection terminal 1 is set to "L" at test mode time. In this mode, the content of the scan register is inputted to the circuit block to be tested, and the output of the circuit block to be tested is then inputted to the scan register.

The waveforms of the example of this operation are shown in FIG. 14. In FIG. 14, the test mode is obtained when the input 1 is set to "L". In the test mode in FIG. 10, pulses are outputted to the inputs 36a, 36b, 37b and not outputted to the input 37c, the output data to the scan registers 8a, 9a, 12a, 13a are respectively "H", "L", "H", "H". Assume that the scan registers 10a, 11a output "H", "L", these test data can be applied to the circuit block to be tested by setting the latches 75, 76 and the gates 70 to 73 to through states. In FIG. 10, the outputs of the latches 75, 76 are outputted synchronously with the rises of the latch control signals 81e, 82e to vary like signals 36ce, 37ae, and the data are held in the latches 75, 76. Since the outputs of the gates 70 to 73 are outputted only during the periods of 80p, 90p, 80p, 91p, they become as waveforms 36ap, 36bp, 37bp, 37cp.

Thus, after the test data are applied to the circuit block to be tested, the test result outputted from the circuit block is inputted to the scan register by applying the pulse 6p to the scan clock input terminal 6. This test result data are sequentially scanned out at next scanning time.

In the embodiment described above, the latches, the AND or OR gate is connected to the output of the scan register. Therefore, its control input is controlled to stop the operation of the circuit to be tested by controlling the control input, and the test pulse of "H" or "L" of arbitrary timing can be applied to the circuit to be tested. Since the test data of the respective circuit blocks are applied only by the scan data, the test data can be generated without influence of other circuit block, and the scan test can be readily executed.

When the AND gates and the OR gates are ordinarily provided, separate control signals are connected to the control inputs. In this embodiment, since the inverters are connected to the control input terminals of the OR gates, the positive type signal and the negative type signal having the same timing can be controlled by one control input, thereby reducing the number of pins of the integrated circuit.

In the embodiment described above, the case that the inverters are provided at the control input terminals of the OR gates has been described. However, the inverters may be provided at the control input terminal of the AND gates 70, 72, thereby providing the same advantages as those in the above embodiment.

In the embodiment described above, the case that the control inputs of the AND and OR gates of the same stage are connected has been described. However, if the input timings of the circuit blocks 36 and 37 are equal, all the control inputs of the gates 70 to 73 may be connected to the same control signal.

According to the present invention as described above, the first and second gate circuits and the latch circuit for holding and outputting the first fixed data, the second fixed data having opposite logic value to the first data, or output data of the scan registers before the scanning operation to the output terminal of the scan register between the circuit block to be tested in the test mode at the ordinary operation and testing times and a predetermined fixed data or the output data of the scan register before the scanning operation in the scan mode at the testing time is provided to control the output of the test data by the gate control input. Therefore, the operation of the circuit block to be tested can be stopped at scanning time. Since the test data of the circuit blocks are applied only by the scan data, the test data can be produced without influence of the other circuit block, thereby readily executing the scan test. Further, the test pulse of the arbitrary timing can be applied to the circuit to be tested. Moreover, since the same control signals are connected to the control input terminals of the first and second gates and the positive type signal and the negative type signal having the same timing are controlled by one control input, the number of pins of the integrated circuit can be reduced.

What is claimed is:

1. A semiconductor integrated circuit device for transmitting data between a plurality of circuit blocks at least one thereof including an asynchronous sequential circuit block and for scan testing said asychronous sequential circuit block, said device comprising:
   a plurality of scan registers provided between the plurality of circuit blocks corresponding to the number of bits of data to be transmitted for outputting the output data of the previous stage circuit block as it is at ordinary operating time and for holding and outputting the output data of the previous circuit block or test data synchronously with an external clock at testing time so that the circuits are connected by a shift register pass in such a manner that the entirety has one shift register function, a control circuit connected at its data input terminal to the output terminals of said predetermined scan register and at its output terminal to the predetermined input terminal of the predetermined circuit block for outputting the output data of the corresponding scan register to a next stage circuit block as it is in a ordinary mode and outputting the data held at a predetermined value to the circuit block of next stage in a scan mode at testing time, test data setting means for providing serial test data applied thereto from the exterior of the circuit device to each of said scan registers, test result outputting means for sequentially outputting the data of each scan register as serial data out of the circuit device, and operation switching means for switching between the ordinary operation and the testing operation and between the scan mode and the test mode.

2. The semiconductor integrated circuit device as claimed in claim 1, wherein said control circuit is a 2-input AND circuit, and a predetermined value outputted in the scan mode is "L" level.

3. The semiconductor integrated circuit device as claimed in claim 1, wherein said control circuit is a 2-input OR circuit, and a predetermined value outputted in the scan mode is "H" level.

4. The semiconductor integrated circuit device as claimed in claim 1, wherein said control circuit is a through latch, and a predetermined value outputted in the scan mode is output data immediately before entering the scan mode.

5. The semiconductor integrated circuit device as claimed in claim 1, wherein said control circuit is a 2-input AND circuit connected at the control input terminal with a NOT circuit.

6. The semiconductor integrated circuit device as claimed in claim 1, wherein said control circuit is a 2-input OR circuit connected at the control input terminal with a NOT circuit.

7. The semiconductor integrated circuit device as claimed in claim 2, wherein a plurality of said 2-input AND circuit are provided, and at least two of them are commonly connected at the control input terminals.

8. The semiconductor integrated circuit device as claimed in claim 3, wherein a plurality of said 2-input OR circuit are provided, and at least two of them are commonly connected at the control input terminals.

9. The semiconductor integrated circuit device as claimed in claim 4, wherein said control circuit is a 2-input AND gate circuit, a predetermined value outputted in the scan mode is "L" level, and said control input terminal of the through latch is commonly connected to the control input terminal of the AND gate circuit.

10. The semiconductor integrated circuit device as claimed in claim 1 wherein said control circuit includes a 2-input AND gate circuit connected at the control input terminal with a NOT circuit, and the control input terminal of the AND gate circuit and the input terminal of the NOT circuit are connected to the same control signal input terminal.

11. A semiconductor circuit device comprising:
a first circuit stage having an output;
a second, asynchronous sequential circuit stage having an input;
a test mode selection terminal;
a latch control input terminal; and
testing means, connected between said first circuit stage output and said second circuit stage input and connected to said test mode selection terminal, for alternately operating in (a) a normal mode, and (b) a testing mode in response to test mode selection signals appearing at said test mode selection terminal, said testing means including:
scanning shift register means having an output and connected to receive said first circuit stage output for passing said first circuit stage output to said output thereof in said normal mode, and in said testing mode for latching said first circuit stage output and serially shifting said latched output; and
gating means, connected between said scanning shift register means output and said second circuit stage input and also connected to said latch control input terminal, for in said testing mode alternately (i) applying the output of said scanning shift register means to said second circuit stage input, and (ii) applying data signals to said second circuit stage input responsive to signals appearing on said latch control input terminal independently of the outputs latched by said scanning shift register means.

12. A device as in claim 11 wherein said gating means includes means for applying a pulse to said second circuit stage input, said pulse having a duration and timing determined in response to a signal appearing on said latch control input terminal.

13. A device as in claim 11 wherein said gating means includes means for preventing signal level changes at said scanning shift register means output from propagating to said second circuit stage input whenever said scanning shift register means is latching and/or shifting said first circuit stage output.

14. a semiconductor integrated circuit device comprising:
a first circuit having at least an output;
a second, asynchronous sequential circuit having an input and an output;
a test mode selection terminal;
a test input terminal;
a test output terminal;
a scan clock input terminal;
a latch control input terminal; and
testing means, connected between said first circuit output and said second circuit input and connected to said test mode selection terminal, for alternately operating in (a) a normal mode, and (b) a testing mode in response to test mode selection signals appearing on said test mode selection terminal, said testing means including:
scanning shift register means connected to said first circuit output and also connected to said test input terminal, said test output terminal and said scan clock input terminal, for passing said first circuit output to an output thereof in said normal mode, and in said testing mode for latching said first circuit output, serially shifting said latched output to said test output terminal and serially shifting in test signals appearing on said test input terminal in response to a scan clock signal appearing on said scan clock input terminal, and
gating means, connected between said scanning shift register means output and said second circuit input and also connected to said latch control input terminal, for preventing signal level changes at said scanning shift register means output from propagating to said second circuit input whenever said scanning shift register means is latching and/or shifting said first circuit output, said gating means including means for applying data signals to said second circuit input responsive to signals applied to said latch control input terminal.

* * * * *